United States Patent
Liao

(10) Patent No.: US 7,816,608 B2
(45) Date of Patent: Oct. 19, 2010

(54) CTS AND INSPECTING METHOD THEREOF

(75) Inventor: Guo-Cheng Liao, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/177,339

(22) Filed: Jul. 22, 2008

(65) Prior Publication Data
US 2009/0034680 A1 Feb. 5, 2009

(30) Foreign Application Priority Data
Jul. 30, 2007 (TW) ............... 96127854 A

(51) Int. Cl.
*H05K 1/00* (2006.01)

(52) U.S. Cl. ............... 174/250; 174/255
(58) Field of Classification Search ......... 174/250, 174/255
See application file for complete search history.

(56) References Cited

U.S. PATENT DOCUMENTS

| 6,023,104 A * | 2/2000 | Koizumi et al. ............. 257/797 |
| 6,797,345 B2 * | 9/2004 | Okamoto et al. ............ 428/1.6 |
| 2006/0038280 A1 * | 2/2006 | Jang et al. .................. 257/700 |
| 2006/0250451 A1 * | 11/2006 | Suzuki et al. ................ 347/58 |

* cited by examiner

*Primary Examiner*—Jeremy C Norris
(74) *Attorney, Agent, or Firm*—J.C. Patents

(57) ABSTRACT

A substrate for inspecting a thickness of contacts at least includes a dielectric layer, a first metal layer, and a second metal layer. The first metal layer which includes a circuit region and a testing region is formed on an upper surface of the dielectric layer, and the circuit region has a plurality of contacts. The second metal layer which has a hollowed region is formed on a lower surface of the dielectric layer, and the hollowed region is aligned with the testing region of the first metal layer to avoid the interference when the testing region is inspected.

7 Claims, 5 Drawing Sheets

CTS AND INSPECTING METHOD THEREOF

CROSS-REFERENCE TO RELATED APPLICATION

This application claims the priority benefit of Taiwan application serial no. 96127854, filed on Jul. 30, 2007. The entirety of the above-mentioned patent application is hereby incorporated by reference herein and made a part of this specification.

BACKGROUND OF THE INVENTION

1. Field of the Invention

The present invention generally relates to a substrate, in particular, to a substrate for inspecting a thickness of contacts.

2. Description of Related Art

Contacts on substrates of the conventional FCBGA and CSP package adopt the design of copper contacts. After the bonding of the copper contacts and solder balls, a reaction may be produced to cause a tin and copper intermetallic phenomenon which may aggravate due to the time and temperature. As a result, the copper contacts may be consumed, and thus the bonding strength between the contacts and the substrate is reduced to cause a failure of the electronic product at last. Therefore, the thickness of the copper contacts needs to be inspected firstly. A conventional method for inspecting the copper contacts is a destructive inspection method, in which the substrate is sliced for measurement. However, the inspecting time of the destructive inspection method is relatively long, the measurement error is considerably large, and the substrate is destroyed.

SUMMARY OF THE INVENTION

Accordingly, the present invention is directed to a substrate for inspecting a thickness of contacts, which mainly includes a dielectric layer, a first metal layer, and a second metal layer. The dielectric layer has an upper surface and a lower surface. The first metal layer including a circuit region and a testing region is formed on the upper surface of the dielectric layer, and the circuit region has a plurality of contacts. The second metal layer having a hollowed region is formed on the lower surface of the dielectric layer, and the hollowed region is aligned with the testing region. The thickness of the contacts is obtained by inspecting the thickness of the testing region, and the hollowed region of the second metal layer may avoid the interference when the testing region of the first metal layer is inspected.

The present invention is also directed to provide a substrate for inspecting a thickness of contacts, in which the testing region is located on an outer side of the circuit region, and the testing region is located on a corner of the first metal layer, so as to maintain the integrity of the substrate circuit without destroying the structure of the substrate.

The substrate for inspecting a thickness of contacts according to the present invention mainly includes a first dielectric layer, a first metal layer, and a second metal layer. The first dielectric layer has an upper surface and a lower surface. The first metal layer is formed on the upper surface of the first dielectric layer, the first metal layer includes a circuit region and a testing region, and the circuit region has a plurality of contacts. The second metal layer is formed on the lower surface of the first dielectric layer, and the second metal layer has a first hollowed region aligned with the testing region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
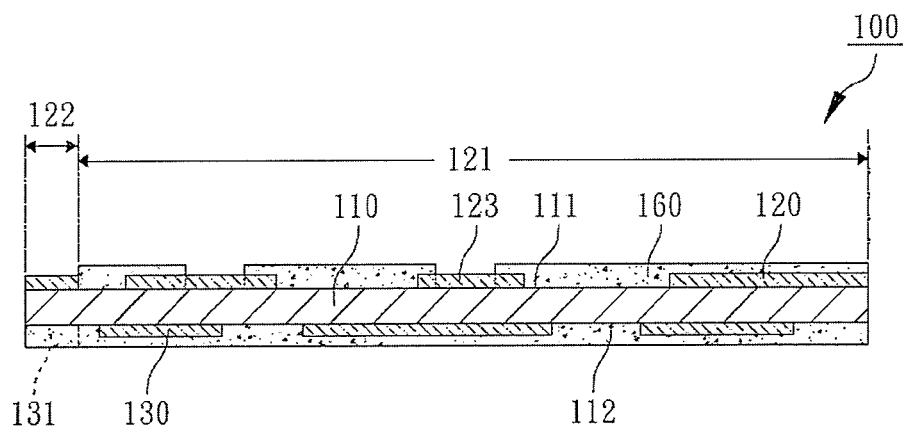
FIG. 1 is a schematic cross-sectional view of a substrate for inspecting a thickness of contacts according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
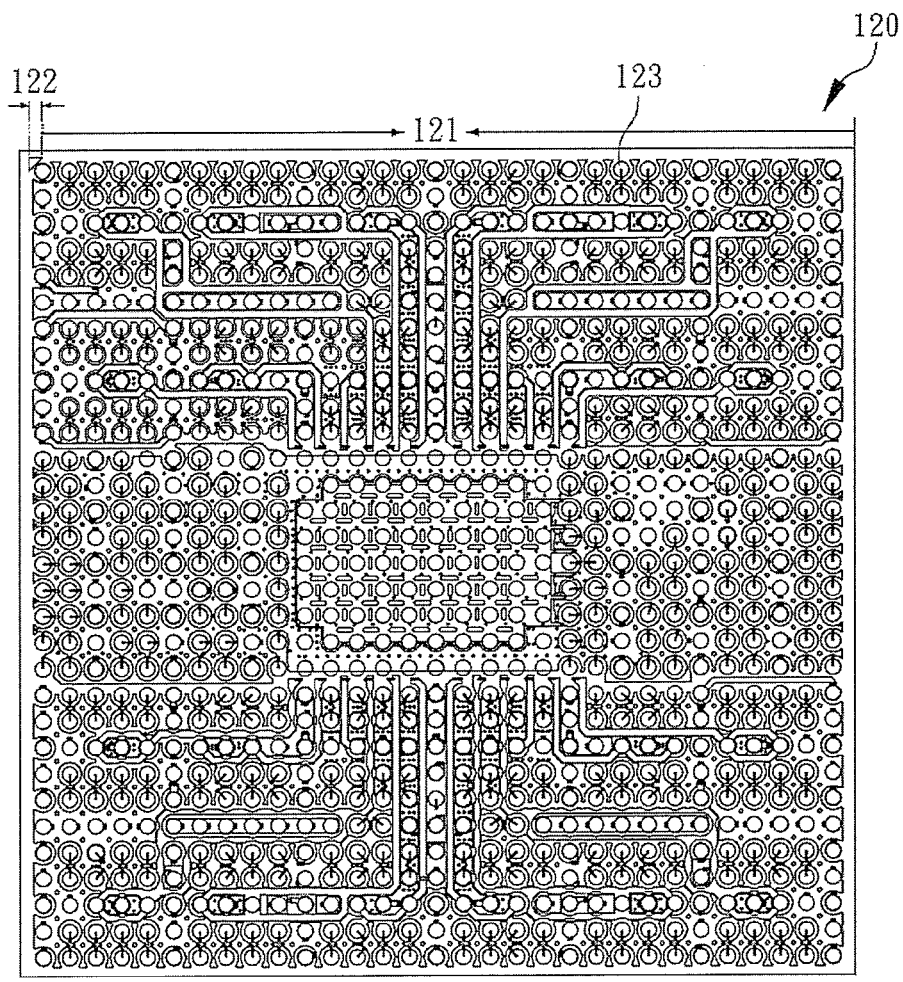
FIG. 2 is a top view of a first metal layer of the substrate for inspecting a thickness of contacts according to an embodiment of the present invention.
Figure 3:
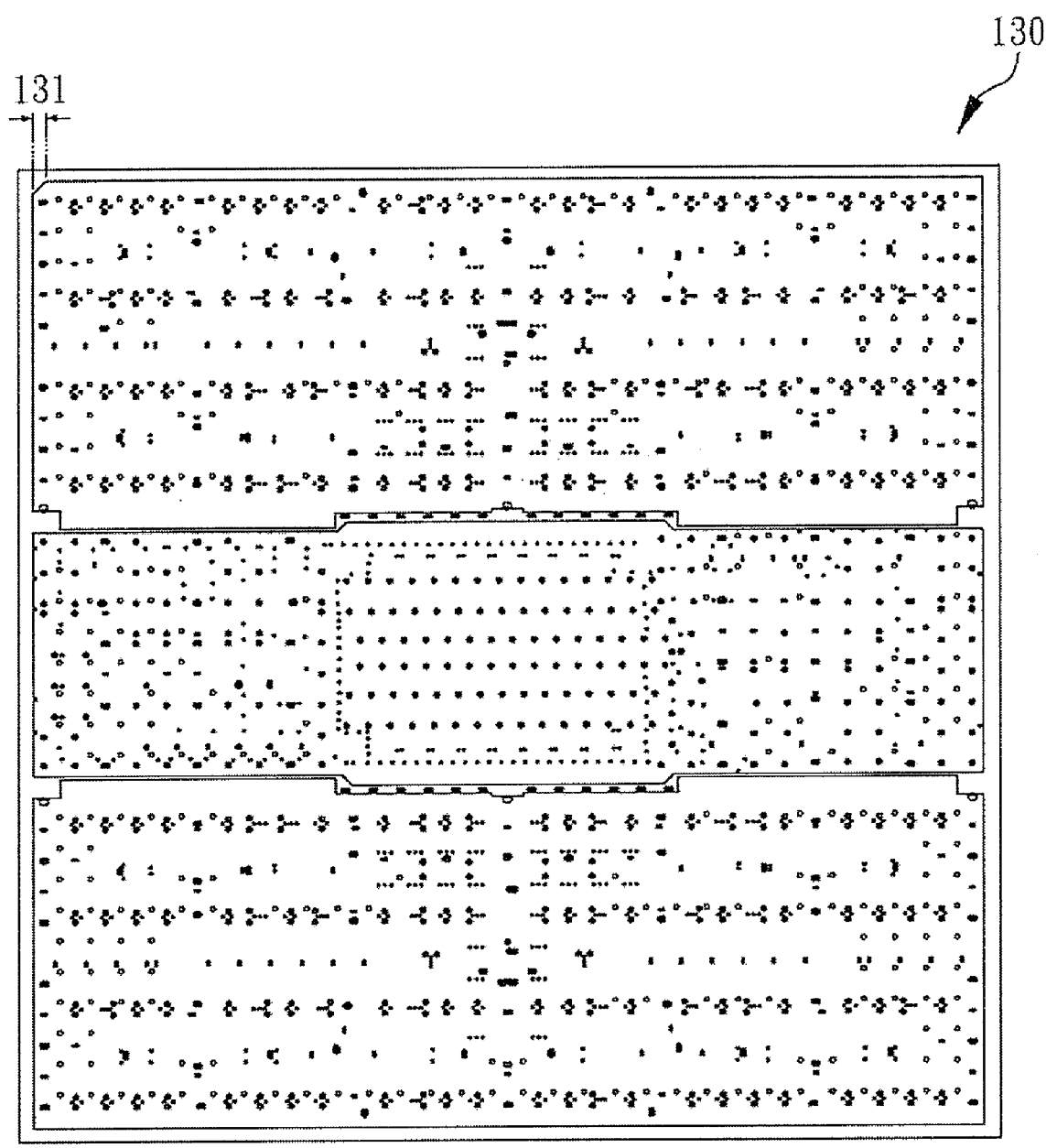
FIG. 3 is a top view of a second metal layer of the substrate for inspecting a thickness of contacts according to an embodiment of the present invention.
Figure 4:
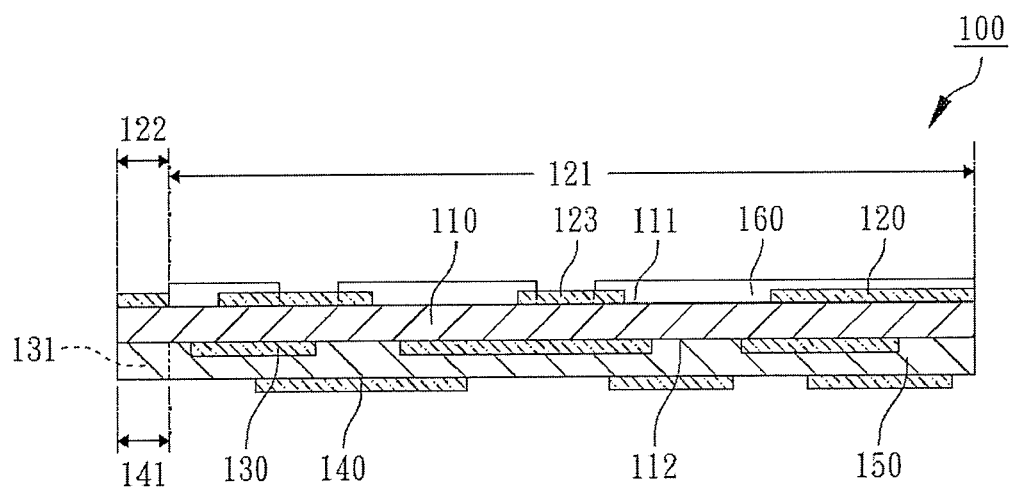
FIG. 4 is a partial schematic cross-sectional view of a substrate for inspecting a thickness of contacts according to another embodiment of the present invention.
Figure 5:
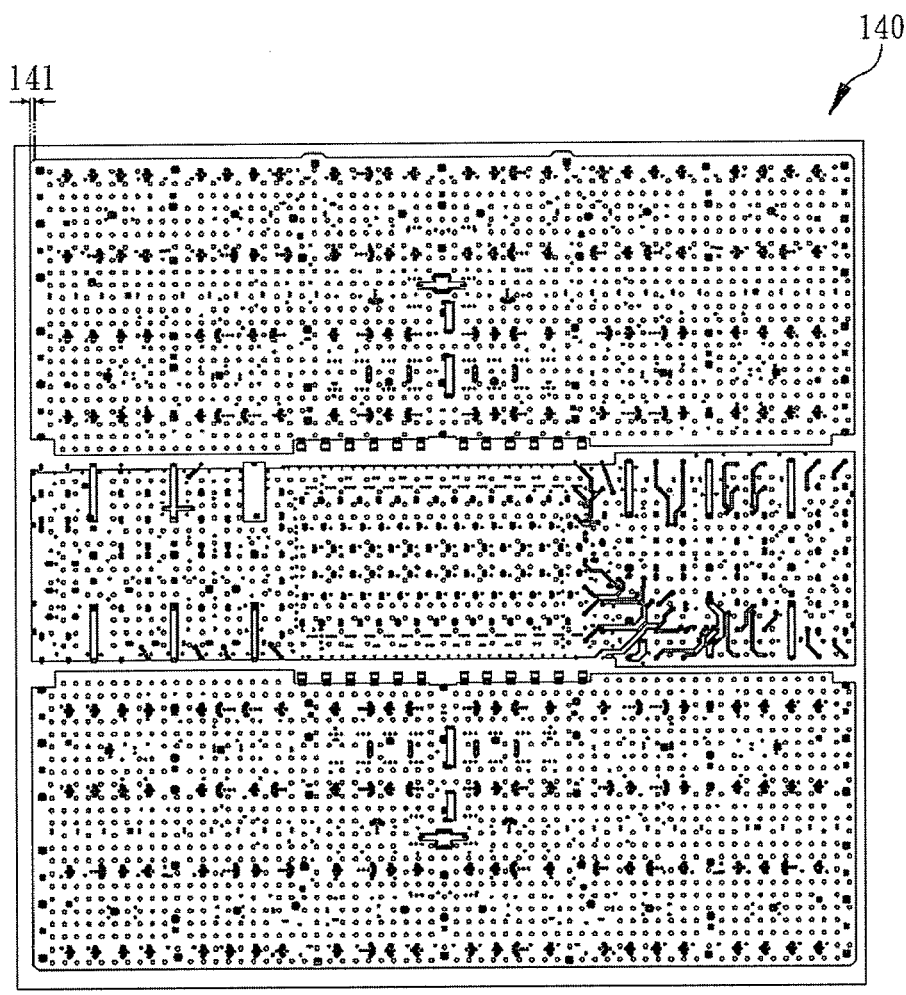
FIG. 5 is a top view of a third metal layer of the substrate for inspecting a thickness of contacts according to another embodiment of the present invention.

FIG. 1 shows a substrate 100 for inspecting a thickness of contacts according to an embodiment of the present invention. The substrate 100 includes a first dielectric layer 110, a first metal layer 120, and at least one second metal layer 130. The first dielectric layer 110 has an upper surface 111 and a lower surface 112. The first metal layer 120 is formed on the upper surface 111 of the first dielectric layer 110. Referring to FIGS. 1 and 2, in this embodiment, the material of the first metal layer 120 is copper. The first metal layer 120 may be a patterned copper layer, and the first metal layer 120 includes a circuit region 121 and a testing region 122. Preferably, the circuit region 121 is not electrically connected to the testing region 122, and the circuit region 121 has a plurality of contacts 123. In this embodiment, the testing region 122 may be a triangular mark position on the substrate 100, which is used for positioning. Referring to FIGS. 1 and 3, the second metal layer 130 is formed on the lower surface 112 of the first dielectric layer 110, and the material of the second metal layer 130 may be copper. The second metal layer 130 may be a power source layer, a ground layer, or a patterned circuit layer. The second metal layer 130 has a first hollowed region 131, and the first hollowed region 131 is aligned with the testing region 122. Or, referring to FIG. 4, in another embodiment, the substrate 100 may be a multi-layer circuit substrate, and further includes at least one third metal layer 140 and at least one second dielectric layer 150. Referring to FIGS. 4 and 5, the third metal layer 140 has a second hollowed region 141.

Figure 6:
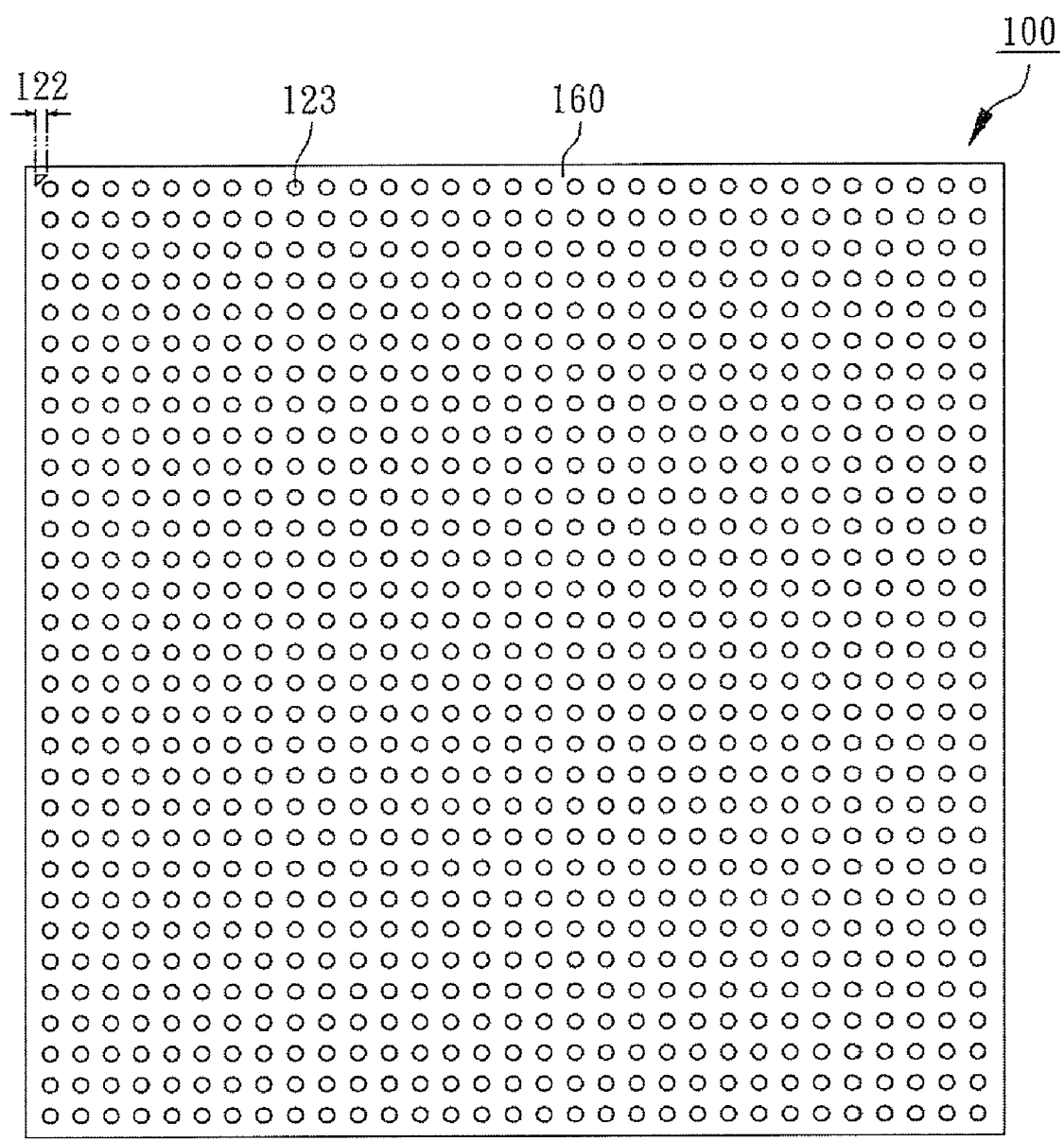
FIG. 6 is a top view of a solder mask of the substrate for inspecting a thickness of contacts according to an embodiment of the present invention.

The second hollowed region 141 is aligned with the testing region 122, and the second dielectric layer 150 is located between the second metal layer 130 and the third metal layer 140. Furthermore, referring to FIGS. 1, 4, and 6, the substrate 100 may include a solder mask 160, and the solder mask 160 covers the first metal layer 120 and exposes the testing region 122 and the contacts 123. The present invention is directed to solve the problems of the conventional art that the inspecting time is longer, the measurement error is larger, and the substrate is destroyed when the contacts are measured in the destructive inspection manner. Therefore, the present invention adopts an X-ray thickness measuring device to measure the thickness of the contacts 123, so as to obtain the thickness of the contacts 123 of the circuit region 121 by inspecting the thickness of the testing region 122. The first hollowed region 131 of the second metal layer 130 and the second hollowed region 141 of the third metal layer 140 are aligned with the testing region 122, so as to avoid the interference resulting from the second metal layer 130 and the third metal layer 140 when the testing region 122 is inspected by the X-ray. Preferably, the testing region 122 is located on an outer side of the circuit region 121. In this embodiment, the testing region 122 is located on a corner of the first metal layer 120, and the testing region 122 is originally a triangular mark position on the substrate 100, which is used for positioning. Therefore, the integrity of the circuit of the substrate 100 is maintained and the structure of the substrate 100 will not be destroyed.

Figure 7:
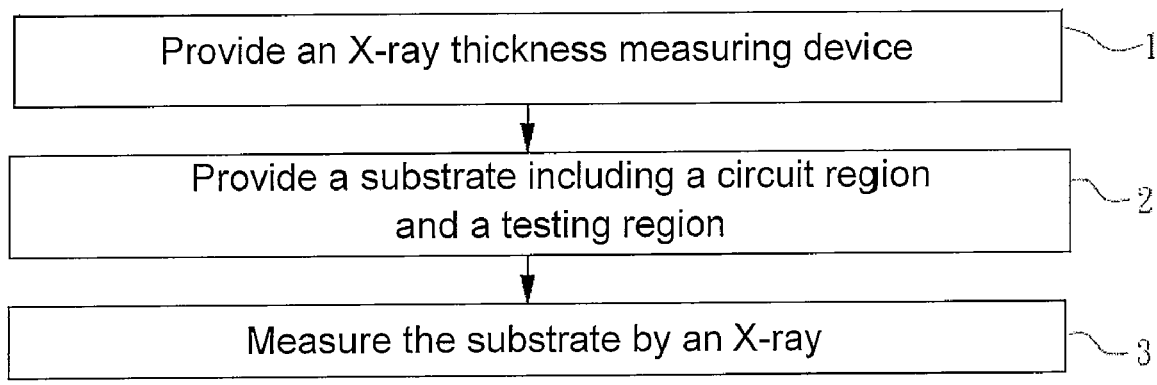
FIG. 7 is a schematic view of processes of inspecting the thickness of the contacts of the substrate by the use of an X-ray thickness measuring device according to an embodiment of the present invention.

FIG. 7 is a schematic view of processes of inspecting the thickness of the contacts 123 of the substrate 100 by the use of an X-ray thickness measuring device according to an embodiment of the present invention. The method sequentially includes step 1 "providing an X-ray thickness measuring device," step 2 "providing a substrate," and step 3 "measuring the testing region by the X-ray." First, in step 1, an X-ray thickness measuring device is provided (not shown). Next, in step 2, referring to FIG. 1, a substrate is provided. The substrate 100 includes a first dielectric layer 110, a first metal layer 120, and a second metal layer 130. The first dielectric layer 110 has an upper surface 111 and a lower surface 112. The first metal layer 120 is formed on the upper surface 111 of the first dielectric layer 110. The first metal layer 120 includes a circuit region 121 and a testing region 122, and the circuit region 121 has a plurality of contacts 123. The second metal layer 130 is formed on the lower surface 112 of the first dielectric layer 110, and has a first hollowed region 131 aligned with the testing region 122. Or, referring to FIG. 4, in another embodiment, the substrate 100 may be a multi-layer circuit substrate, and further includes at least one third metal layer 140 and at least one second dielectric layer 150. The third metal layer 140 has a second hollowed region 141, and the second hollowed region 141 is aligned with the testing region 122. The second dielectric layer 150 is located between the second metal layer 130 and the third metal layer 140. Finally, in step 3, the substrate 100 is measured by the X-ray. The substrate 100 is placed in the X-ray thickness measuring device, and the thickness of the testing region 122 is measured by the X-ray, so as to obtain the thickness of the contacts 123 of the substrate 100. The testing region 122 is originally the triangular mark position on the substrate 100, which is used for positioning. The present invention is a non-destructive inspection method. In the non-destructive inspection method, the thickness of the contacts 123 is obtained by measuring the thickness of the testing region 122 of the first metal layer 120 by the X-ray, and the first hollowed region 131 of the second metal layer 130 is aligned with the testing region 122, so as to avoid the interference of the second metal layer 130 on the X-ray.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate for inspecting a thickness of contacts, comprising:
   a first dielectric layer, comprising an upper surface and a lower surface;
   a first metal layer, formed on the upper surface of the first dielectric layer, and comprising a circuit region and a testing region, wherein the circuit region comprises a plurality of contacts; and
   a second metal layer, formed on the lower surface of the first dielectric layer, and comprising a first hollowed region aligned with the testing region, wherein the second metal layer is a ground layer or a power source layer;
   a third metal layer, wherein the third metal layer comprises a second hollowed region aligned with the testing region;
   a second dielectric layer located between the second metal layer and the third metal layer.

2. The substrate for inspecting a thickness of contacts according to claim 1, wherein a material of the first metal layer is copper.

3. The substrate for inspecting a thickness of contacts according to claim 1, wherein the circuit region is not electrically connected to the testing region.

4. The substrate for inspecting a thickness of contacts according to claim 1, wherein the second metal layer is a patterned circuit layer.

5. The substrate for inspecting a thickness of contacts according to claim 1, wherein the testing region is located on an outer side of the circuit region.

6. The substrate for inspecting a thickness of contacts according to claim 1, wherein the testing region is located on a corner of the first metal layer.

7. The substrate for inspecting a thickness of contacts according to claim 1, wherein the testing region is a triangular mark used for positioning.

* * * * *